US012641889B2

(12) United States Patent
Chen et al.

(10) Patent No.: US 12,641,889 B2
(45) Date of Patent: May 26, 2026

(54) SOLAR CELL, PHOTOVOLTAIC MODULE, AND PHOTOVOLTAIC SYSTEM

(71) Applicant: TRINA SOLAR CO., LTD., Changzhou (CN)

(72) Inventors: Daming Chen, Changzhou (CN); Wei Liu, Changzhou (CN); Yunyun Hu, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/809,868

(22) Filed: Aug. 20, 2024

(65) Prior Publication Data

US 2024/0413259 A1    Dec. 12, 2024

(30) Foreign Application Priority Data

Jan. 29, 2024    (CN) .......................... 202410118651.4

(51) Int. Cl.
*H10F 10/14*        (2025.01)
*H10F 77/20*        (2025.01)
*H10F 77/30*        (2025.01)

(52) U.S. Cl.
CPC ......... *H10F 10/148* (2025.01); *H10F 77/227* (2025.01); *H10F 77/315* (2025.01)

(58) Field of Classification Search
CPC .... H10F 10/148; H10F 77/227; H10F 77/315; H10F 10/146; H10F 10/165;
(Continued)

(56) References Cited

U.S. PATENT DOCUMENTS

2013/0186456 A1    7/2013    Ide et al.
2016/0087122 A1*    3/2016    Westerberg ........... H10F 77/147
136/258
(Continued)

FOREIGN PATENT DOCUMENTS

CN        105122460 A    12/2015
CN        114122162 A    3/2022
(Continued)

OTHER PUBLICATIONS

Office Action, Japanese Patent Application No. 2024-113149, dated Aug. 5, 2025.
(Continued)

*Primary Examiner* — Angelo Trivisonno
(74) *Attorney, Agent, or Firm* — MARSHALL, GERSTEIN & BORUN LLP

(57)        ABSTRACT
A solar cell includes a semiconducting substrate, a first emitter, an insulating layer, and a second emitter. The semiconducting substrate includes a first surface and a second surface, and includes a first region and a second region. The first region includes a first sub-region and a second sub-region. The first sub-region is in contact with the second region. The first direction is perpendicular to the thickness direction of the semiconducting substrate. The first emitter is disposed on the first surface and in the first region. The insulating layer is disposed on the first emitter and in the first sub-region. The second emitter is disposed on the first surface. The second emitter includes a first sub-emitter and a second sub-emitter. The first sub-emitter is located on the second region. The second sub-emitter is disposed on the insulating layer. Electrical conduction exists between the first emitter and the first sub-emitter.

16 Claims, 3 Drawing Sheets

(58) Field of Classification Search
CPC .... H10F 10/166; H10F 71/121; H10F 77/147; H10F 77/14; H10F 77/20; H10F 77/211; H10F 77/311
See application file for complete search history.

(56) References Cited

U.S. PATENT DOCUMENTS

| | | | |
|---|---|---|---|
| 2016/0284923 A1* | 9/2016 | Johnson | ................ H10F 10/146 |
| 2020/0075784 A1 | 3/2020 | Rim et al. | |
| 2023/0163225 A1 | 5/2023 | Westerberg et al. | |

FOREIGN PATENT DOCUMENTS

| | | | |
|---|---|---|---|
| CN | 216488083 | U | 5/2022 |
| CN | 115939240 | A | 4/2023 |
| CN | 116230783 | A | 6/2023 |
| CN | 116404050 | A | 7/2023 |
| CN | 116525708 | A | 8/2023 |
| CN | 116825901 | A | 9/2023 |
| CN | 117117023 | A | 11/2023 |
| CN | 117423762 | A | 1/2024 |
| JP | 2017503355 | A | 1/2017 |
| WO | WO-2023/050823 | A1 | 4/2023 |

OTHER PUBLICATIONS

Office Action, Chinese Patent Application No. 202410118651.4, dated Mar. 7, 2024.
Grant Decision, Chinese Patent Application No. 202410118651.4, dated Apr. 3, 2024.
European Search Report, European Patent Application No. 24191111.4, dated Jan. 10, 2025.
Office Action, Japanese Patent Application No. 2024-113149, dated Dec. 2, 2025.

* cited by examiner

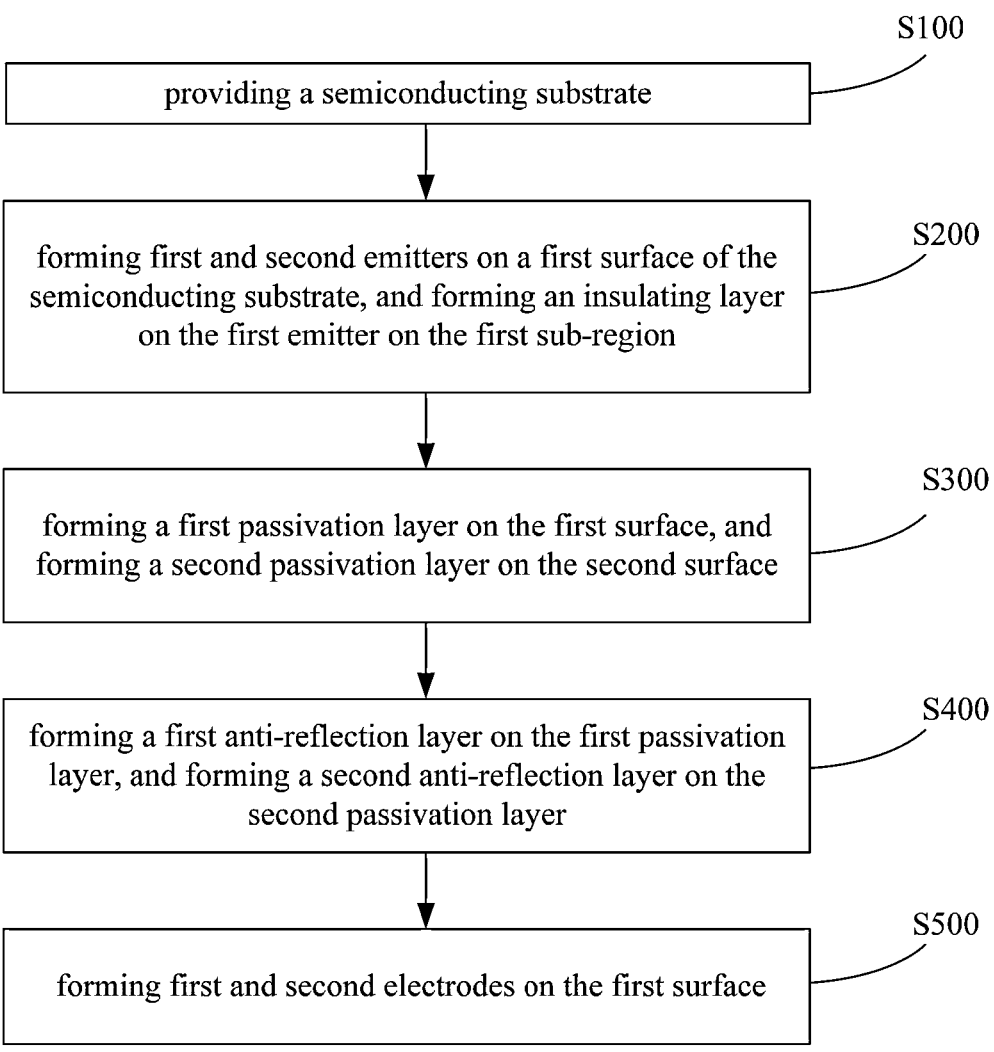

S100 providing a semiconducting substrate

S200 forming first and second emitters on a first surface of the semiconducting substrate, and forming an insulating layer on the first emitter on the first sub-region

S300 forming a first passivation layer on the first surface, and forming a second passivation layer on the second surface

S400 forming a first anti-reflection layer on the first passivation layer, and forming a second anti-reflection layer on the second passivation layer

S500 forming first and second electrodes on the first surface

FIG. 4

SOLAR CELL, PHOTOVOLTAIC MODULE, AND PHOTOVOLTAIC SYSTEM

CROSS-REFERENCE TO RELATED APPLICATION

This application claims priority to Chinese patent application No. 202410118651.4, filed on Jan. 29, 2024, and titled "SOLAR CELL AND PREPARATION METHOD THEREOF, PHOTOVOLTAIC MODULE, AND PHOTO-VOLTAIC SYSTEM", the content of which is hereby incorporated herein in its entirety by reference.

TECHNICAL FIELD

The present application relates to the field of solar cell technology, specifically to solar cells, photovoltaic modules, and photovoltaic systems.

BACKGROUND

Solar cells are devices that directly convert light energy into electrical energy through the photovoltaic effect. Solar cells are commonly prepared on semiconductor chips or substrates by using semiconductor processing technology to form a p-n junction adjacent to a surface of the substrate.

In an interdigitated back contact (IBC) solar cell, p-n junctions are located on the back side of the substrate, with p-doped and n-doped areas alternately arranged along the surface of the substrate. Solar radiation that irradiates the front side of the substrate enters the substrate and induces generation of electron-hole pairs within the substrate. These electron-hole pairs migrate to the p-doped and n-doped areas on the back side of the substrate, thereby generating a voltage difference between the doped areas. The doped areas are electrically connected to an external circuit through metal electrodes, thereby conducting electric currents from the solar cell to the external circuit.

SUMMARY

In view of this, there is a need to provide a solar cell, a method for preparing the same, a photovoltaic module, and a photovoltaic system.

A first aspect of the present application provides a solar cell, including a semiconducting substrate, a first emitter, an insulating layer, and a second emitter.

The semiconducting substrate includes a first surface and a second surface that are opposite to each other, the semiconducting substrate includes a first region and a second region that are arranged adjacent to each other in a first direction, the first region includes a first sub-region and a second sub-region that are arranged adjacent to each other in the first direction, the first sub-region is in contact with the second region, and the first direction is perpendicular to the thickness direction of the semiconducting substrate.

The first emitter is disposed on the first surface and located on the first region.

The insulating layer is disposed on the first emitter and located on the first sub-region.

The second emitter is disposed on the first surface, the second emitter includes a first sub-emitter and a second sub-emitter that are connected with each other, the first sub-emitter is located on the second region, the second sub-emitter is disposed on the insulating layer, and electrical conduction exists between the first emitter and the first sub-emitter.

In some embodiments, the first surface includes a first sub-surface located in the first region and a second sub-surface located in the second region. The minimum distance between the first sub-surface and the second surface is greater than the minimum distance between the second sub-surface and the second surface. The first emitter is disposed on the first sub-surface, and the first sub-emitter is disposed on the second sub-surface. Along the first direction, an orthogonal projection of the first emitter on a first plane overlaps with an orthogonal projection of the first sub-emitter on the first plane, forming an overlapping area. The first emitter includes a sidewall adjacent to the second region. Electrical conduction exists between the sidewall and the first sub-emitter. The first plane is parallel to the thickness direction of the semiconducting substrate and perpendicular to the first direction.

In some embodiments, the solar cell further includes a first tunneling layer, disposed between the first emitter and the semiconducting substrate; and a second tunneling layer, disposed between the second emitter and the semiconducting substrate. A portion of the second tunneling layer is disposed on the sidewall of the first emitter that is adjacent to the second region and is disposed between the first emitter and the first sub-emitter.

In some embodiments, the second tunneling layer includes a first sub-tunneling layer, disposed on the second sub-surface; and a second sub-tunneling layer, disposed on the sidewall of the first emitter that is adjacent to the second region. The second sub-tunneling layer is located between the first emitter and the first sub-emitter.

In some embodiments, the first sub-tunneling layer is spaced apart from the second sub-tunneling layer. The first sub-emitter covers at least a surface of the first sub-tunneling layer away from the semiconducting substrate, a sidewall of the first tunneling layer adjacent to the second region, and a sidewall of the second sub-tunneling layer adjacent to the second region.

In some embodiments, one end of the second sub-tunneling layer is connected to the first sub-tunneling layer, while another end of the second sub-tunneling layer extends in a direction away from the semiconducting substrate. The second sub-tunneling layer covers at least a sidewall of the first tunneling layer adjacent to the second region, a sidewall of the first emitter adjacent to the second region, and a sidewall of the insulating layer adjacent to the second region. The second tunneling layer further includes a third sub-tunneling layer. The third sub-tunneling layer is connected to the second sub-tunneling layer, and is located between the insulating layer and the second sub-emitter.

In some embodiments, the solar cell further includes a first electrode and a second electrode. The first electrode is disposed on a side of the first emitter that is away from the semiconducting substrate, and electrically connected to the first emitter. The first electrode is spaced apart from the insulating layer. The second electrode is disposed on a side of the second emitter that is away from the semiconducting substrate, and electrically connected to the second emitter.

In some embodiments, a sidewall of the insulating layer adjacent to the first electrode is distanced from the center of the first emitter by a first distance along the first direction, the first distance ranges from 3 μm to 10000 μm.

In some embodiments, a size of the insulating layer along the first direction is defined as a first dimension, represented by W, which satisfies $0 < W < L$;

where L is a distance between a sidewall of the first electrode adjacent to the insulating layer and a sidewall of the first emitter adjacent to the second region.

In some embodiments, a thickness of the first emitter is in a range from 5 nm to 2500 nm.

In some embodiments, a thickness of the second emitter is in a range from 5 nm to 2500 nm.

In some embodiments, the first emitter is doped with oxygen, nitrogen, carbon, or any combination thereof.

In some embodiments, the second emitter is doped with oxygen, nitrogen, carbon, or any combination thereof.

In some embodiments, the insulating layer is a silicon oxide dielectric layer.

In some embodiments, the solar cell further includes a first passivation layer, a first anti-reflection layer, a second passivation layer, and a second anti-reflection layer. The first passivation layer is disposed on a side of the first emitter and the second emitter that is away from the semiconducting substrate. The first anti-reflection layer is disposed on a side of the first passivation layer that is away from the semiconducting substrate. The second passivation layer is disposed on the second surface. The second anti-reflection layer is disposed on the side of the second passivation layer that is away from the semiconducting substrate.

A second aspect of the present application provides a method for preparing a solar cell, including:

providing a semiconducting substrate, the semiconducting substrate including a first surface and a second surface opposite to each other, the semiconducting substrate including a first region and a second region arranged adjacent to each other in a first direction, the first region including a first sub-region and a second sub-region arranged adjacent to each other in the first direction, the first sub-region being in contact with the second region, the first direction being perpendicular to the thickness direction of the semiconducting substrate; and forming a first emitter and a second emitter on the first surface, and forming an insulating layer on the first emitter and on the first sub-region; wherein the first emitter is formed on the first region, the second emitter includes a first sub-emitter and a second sub-emitter connected with each other, the first sub-emitter is formed on the second region, the second sub-emitter is formed on the insulating layer, electrical conduction is formed between the first emitter and the first sub-emitter.

A third aspect of the present application provides a photovoltaic module, including the solar cell of any above embodiment.

A fourth aspect of the present application provides a photovoltaic system, including the photovoltaic module in the third aspect.

In the solar cell, the preparation method thereof, the photovoltaic module, and the photovoltaic system provided by the embodiments of the present application, the insulating layer is disposed on the first emitter, the first sub-emitter of the second emitter is located on the second region, the second sub-emitter of the second emitter is disposed on the insulating layer, and electrical conduction is formed between the first emitter and the first sub-emitter so as to form a current leakage path. As such, on the one hand, in a group of solar cells connected in series, when one solar cell is shaded and does not work, the current can flow through the current leakage path in this solar cell, thereby preventing the hotspot effect from occurring in the photovoltaic module, thus increasing the lifetime of the solar cell. On the other hand, since the insulating layer is sandwiched between the first emitter and the second sub-emitter, the current leakage area between the first emitter and the second emitter can be reduced, thereby reducing the leakage current, which is conducive to enhancing the working efficiency of the solar cell. Moreover, during the preparation process of the solar cell, the insulating layer can also protect the first emitter, reducing damage to the first emitter during the preparation process, thus improving the structural integrity of the first emitter, which is thus beneficial for improving the performance of the solar cell.

BRIEF DESCRIPTION OF THE DRAWINGS

In order to more clearly describe the embodiments or examples of the present application, the accompanying drawings to be used in the description of the embodiments or examples will be described briefly. Obviously, the drawings described below are only for some embodiments of the present application. For ordinary skilled persons in the art, other drawings can also be obtained based on the following drawings without creative works.

FIG. 4 is a flow chart of a method for preparing a solar cell according to an embodiment.

Figure 1:
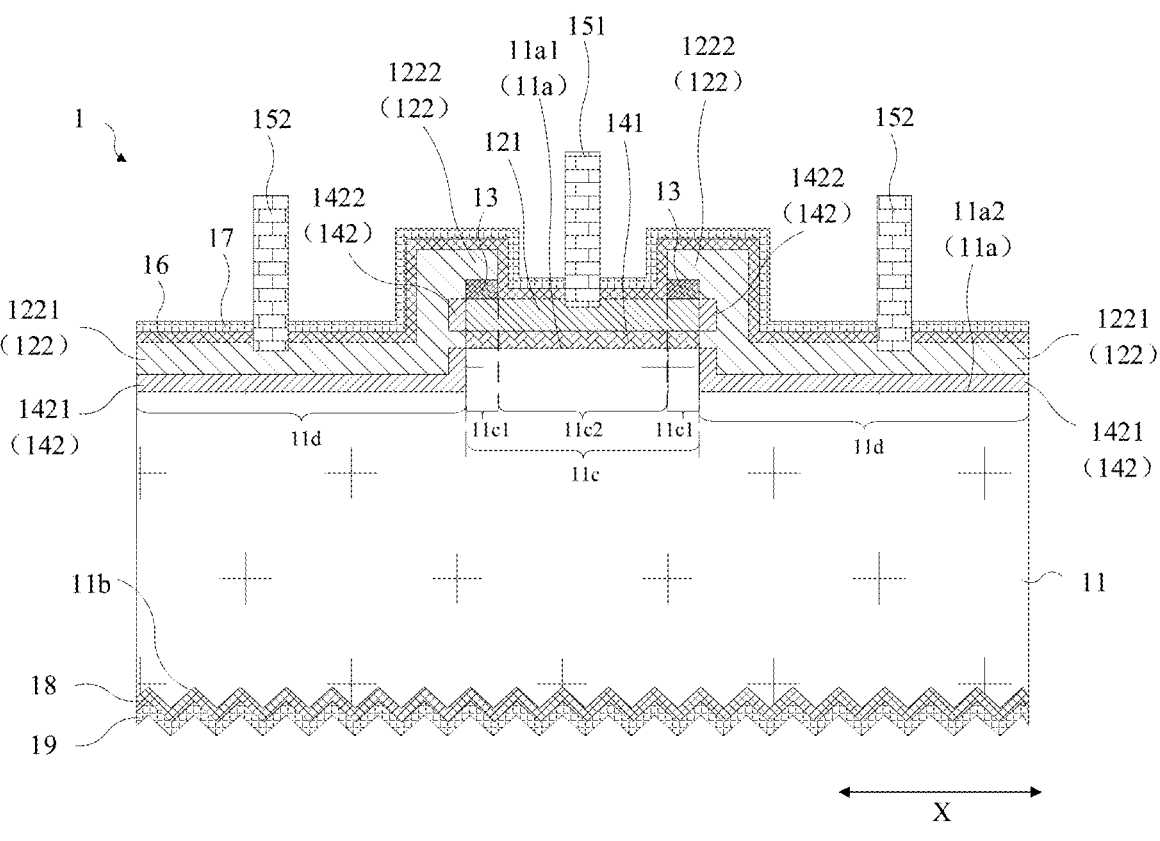
FIG. 1 is a schematic structural sectional partial view of a solar cell according to an embodiment of the present application.

REFERENCE SIGNS 1, solar cell; 11, semiconducting substrate; 11a, first surface; Hal, first sub-surface; 11a2, second sub-surface; 11b, second surface; 11c, first region; 11d1, first sub-region; 11c2, second sub-region; 11d, second region; 121, first emitter; 122, second emitter; 1221, first sub-emitter; 1222, second sub-emitter; 13, insulating layer; 141, first tunneling layer; 142, second tunneling layer; 1421, first sub-tunneling layer; 1422, second sub-tunneling layer; 1423, third sub-tunneling layer; 151, first electrode; 152, second electrode; 16, first passivation layer; 17, first anti-reflection layer; 18, second passivation layer; 19, second anti-reflection layer.

DETAILED DESCRIPTION

The present application will now be described in detail with reference to the accompanying drawings in order to make the objects, features, and advantages of the present application more clear. In the following description, many specific details are explained to make the present application fully understandable. However, the present application can be implemented in many other ways different from those described herein, and those skilled in the art can make similar improvements without departing from the connotation of the present application. Therefore, the present application is not limited by the specific embodiments disclosed below.

Unless defined otherwise, all technical and scientific terms used herein have the same meaning as commonly understood by those skilled in the art of the present application. The terms used in the specification of the present application are for the purpose of describing exemplary examples only and are not intended to limit the present application.

It should be understood that when an element or a layer is referred to as being "on", "adjacent to", "connected to", or "coupled to" another element or layer, it can be directly on, adjacent to, connected to, or coupled to another element or layer, or an intermediate element or layer can be present. In contrast, when an element is referred to as being "directly on", "directly adjacent to", "directly connected to", or "directly coupled to" another element or layer, there is no intervening element or layer. It can be understood that although the terms first, second, third etc. may be used to describe various elements, components, regions, layers, sections, and/or doping types, these elements, components, regions, layers, sections, and/or doping types should not be limited by these terms. These terms are only used to distinguish one element, component, region, layer, section, and/or doping type from another element, component, region, layer, section, and/or doping type. Thus, a first element, component, region, layer, section, and/or doping type described below can be termed as a second element, component, region, layer, section, and/or doping type without departing from the teachings of the present application.

For the convenience of description, the spatial relation terms such as "below", "under", "beneath", "above", "on", "over", etc., may be used herein to describe the relationships of an element or a feature with other elements or features shown in the drawings. It should be understood that the terms of spatial relations are intended to include other different orientations in use or operation in addition to the orientation of the elements or features shown in the drawings. For example, if the drawings are placed upside down, the element or feature which was "above" or "over" other elements or features will be "below" or "under" other elements or features. Thus, the exemplary terms "below" and "beneath" may cover the meanings of "above" or "below". The element or feature can also be positioned in other different ways (e.g., rotating 90 degrees or at other orientations), and the spatial relation terms used herein can be correspondingly interpreted.

As used herein, the singular forms with "a", "an", "the", or "said" are intended to include the plural forms as well, unless the context clearly indicates otherwise. It should also be understood that the terms "consists of" and/or "comprising", when used in the present application, identify the presence of the stated features, integers, steps, operations, elements and/or parts, but do not exclude presence or addition of one or more other features, integers, steps, operations, elements, parts and/or groups. As used herein, the term "and/or" means that any one of the listed items can be employed by itself or any combination of two or more of the listed items can be employed.

The embodiments of the present application are described herein with reference to cross-sectional views of idealized embodiments (and intermediate structures) of the present application. It can be expected that some variations of the shown shapes may exist due to, for example, manufacturing techniques and/or engineering tolerances. Thus, embodiments of the present application should not be limited to the particular shapes of the regions shown herein but include deviations in shapes due to, for example, manufacturing. The regions shown in the drawings are schematic in nature, and their shapes are not intended to be the actual shapes of the regions of the device or limit the scope of the present application.

In the present application, when mentioning that an element is "located on" a region of the semiconducting substrate, it means that this element is located corresponding to this region in the thickness direction of the semiconducting substrate, and that is, the projection of this element is located in the projection of this region on the plane perpendicular to the thickness direction of the semiconducting substrate.

In the related art of the IBC solar cells, grooves are formed between adjacent p-doped and n-doped areas to provide isolation, thus preventing current leakage and enhancing the photovoltaic conversion efficiency. However, such solar cells are susceptible to damage from the hotspot effect.

Figure 2:
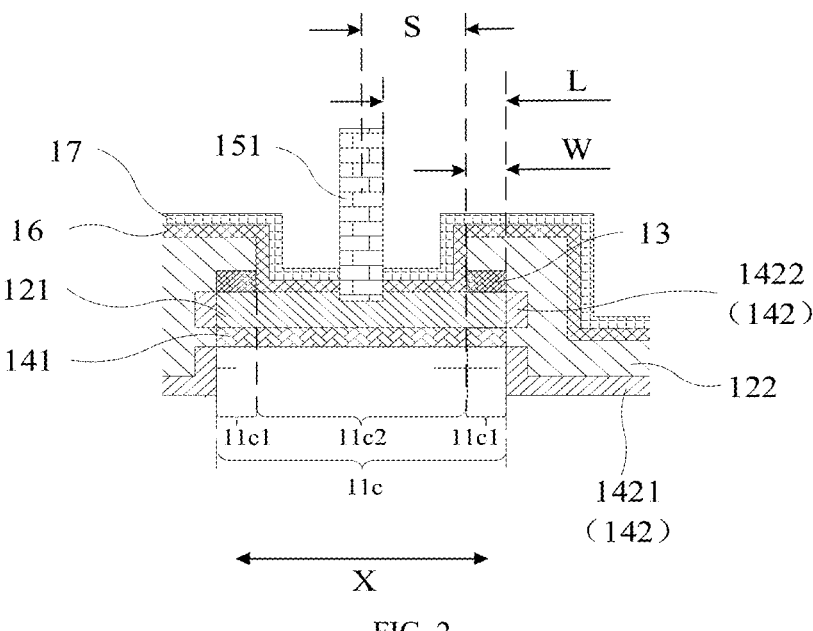
FIG. 2 is a partial view of the solar cell of FIG. 1, showing references signs for sizes of portions of the solar cell.

Referring to FIG. 1 and FIG. 2, according to a first aspect of the present application, an embodiment of a solar cell 1 includes a semiconducting substrate 11, a first emitter 121, an insulating layer 13, and a second emitter 122.

The semiconducting substrate 11 includes a first surface 11a and a second surface 11b that are opposite to each other. In use of the solar cell 1, the first surface 11a can be the back surface away from the sun, and the second surface 11b can be the front surface facing the sun. The semiconducting substrate 11 includes a first region 11c and a second region 11d that are arranged adjacent to each other in a first direction X. The first direction X is a direction perpendicular to the thickness direction of the semiconducting substrate 11. The first region 11c includes a first sub-region 11c1 and a second sub-region 11c2 that are arranged adjacent to each other in the first direction X. The first sub-region 11d1 is in contact with the second region 11d.

The first emitter 121 is disposed on the first surface 11a and located on the first region 11c. The insulating layer 13 is disposed on the first emitter 121 and located on the first sub-region 11c1. The second emitter 122 is disposed on the first surface 11a. The second emitter 122 includes a first sub-emitter 1221 and a second sub-emitter 1222, and the first and second sub-emitters 1221, 1222 are, e.g., physically and/or electrically, connected with each other. In some embodiments, the first and second sub-emitters 1221, 1222 of the same second emitter 122 are together formed as an integrated structure. The first sub-emitter 1221 is located on the second region 11d. The second sub-emitter 1222 is disposed on the insulating layer 13, and thus is located on the first sub-region 11c1. Electrical conduction is formed between the first emitter 121 and the first sub-emitter 1221. It can be understood that a current leakage path can be formed between the first emitter 121 and the first sub-emitter 1221, so as to form the electrical conduction.

The electrical conduction between the first emitter 121 and the first sub-emitter 1221 can be achieved through following methods: As one method, the first emitter 121 and the first sub-emitter 1221 are in direct contact with each other, so as to form the electrical conduction therebetween. As another method, an intermediate medium is disposed between the first emitter 121 and the first sub-emitter 1221, and the intermediate medium is capable of conducting the current from the first emitter 121 to the first sub-emitter 1221, or conducting the current from the first sub-emitter 1221 to the first emitter 121.

In some embodiments, the solar cell 1 further includes a first electrode 151 and a second electrode 152. The first electrode 151 is electrically connected to the first emitter 121, and the second electrode 152 is electrically connected to the second emitter 122. Since the electrical conduction is formed between the first emitter 121 and the first sub-emitter 1221, electrical conduction is formed between the first emitter 121 and the second emitter 122. Thus, a current leakage path can be formed in the solar cell 1 as follows: the electric current is conducted in sequence from the first electrode 151, through the first emitter 121, to the second emitter 122, and then to the second electrode 152; alternatively, the electric current is conducted in sequence from the second electrode 152, through the second emitter 122, to the first emitter 121, and then to the first electrode 151. Thus, in a group of solar cells connected in series, when one solar cell 1 is shaded and does not work, the current can flow through the current leakage path in this solar cell, thereby preventing the hotspot effect from occurring in the photovoltaic module, thus increasing the lifetime of the solar cell 1.

Furthermore, by disposing the insulating layer 13 on the first emitter 121, and sandwiching the insulating layer 13 between the first emitter 121 and the second sub-emitter 1222, the current leakage area between the first emitter 121 and the second emitter 122 can be reduced, thereby reducing the leakage current, which is conducive to enhancing the working efficiency of the solar cell 1. Moreover, during the preparation process of the solar cell 1, the insulating layer 13 can also protect the first emitter 121, reducing damage to the first emitter 121 in the preparation process, thus improving the structural integrity of the first emitter 121, which is thus beneficial for improving the performance of the solar cell 1.

The first emitter 121 is in a first conductivity type, and the second emitter 122 is in a second conductivity type. In the first and second conductivity types, one is the p-type, and the other is the n-type.

In some embodiments, the semiconducting substrate 11 can include a plurality of first regions 11*c* and a plurality of second regions 11*d*. The plurality of first regions 11*c* and the plurality of second regions 11*d* are arranged alternately along the first direction X. That is, there is one first region 11*c* between two adjacent second regions 11*d*, and there is one second region 11*d* between two adjacent first regions 11*c*. The adjacent first regions 11*c* and second regions 11*d* are in contact with each other.

Further, each first region 11*c* is provided with one first emitter 121, and each second region 11*d* is provided with one second emitter 122. One first electrode 151 is disposed on each first emitter 121, and one second electrode 152 is disposed on each second emitter 122. In the embodiment that two second emitters 122 are respectively disposed at the two sides of one first emitter 121 along the first direction X, there are two insulating layers 13 respectively disposed on the two ends of this first emitter 121 along the first direction X.

Referring to FIG. 1, in some embodiments, the first surface 11*a* includes a first sub-surface Ha1 located on the first region 11*c* and a second sub-surface 11*a*2 located on the second region 11*d*. The minimum distance between the first sub-surface 11*al* and the second surface 11*b* is greater than the minimum distance between the second sub-surface 11*a*2 and the second surface 11*b*. In other words, the average height of the first sub-surface 11*al* is higher than the average height of the second sub-surface 11*a*2. In other words, the average thickness of the semiconducting substrate 11 in the first region 11*c* is greater than that in the second region 11*d*.

In some embodiments, the first emitter 121 is disposed on the first sub-surface 11*al*, and the first sub-emitter 1221 is disposed on the second sub-surface 11*a*2. Along the first direction X, an orthogonal projection of the first emitter 121 on a first plane overlaps with an orthogonal projection of the first sub-emitter 1221 on the first plane, thus forming an overlapping area. The first plane is parallel to the thickness direction of the semiconducting substrate 11 and perpendicular to the first direction X. The first emitter 121 includes a sidewall adjacent to the second region 11*d*, and electrical conduction is formed between the sidewall and the first sub-emitter 1221. In FIG. 1, the first plane is a vertical plane.

In some embodiments, the solar cell 1 further includes a first tunneling layer 141 and a second tunneling layer 142.

The first tunneling layer 141 is disposed between the first emitter 121 and the semiconducting substrate 11, and the second tunneling layer 142 is disposed between the second emitter 122 and the semiconducting substrate 11. A portion of the second tunneling layer 142 is disposed on the sidewall of the first emitter 121 that is adjacent to the second region 11*d*, and the portion of the second tunneling layer 142 is disposed between the first emitter 121 and the first sub-emitter 1221.

By providing the first tunneling layer 141 and the second tunneling layer 142, the interface state density between the semiconducting substrate 11 and either the first emitter 121 or the second emitter 122 can be reduced, thereby reducing the carrier recombination and enhancing the efficiency of the solar cell 1. Furthermore, a portion of the second tunneling layer 142 is located between the first emitter 121 and the first sub-emitter 1221, constituting a section of the leakage current path.

Figure 3:
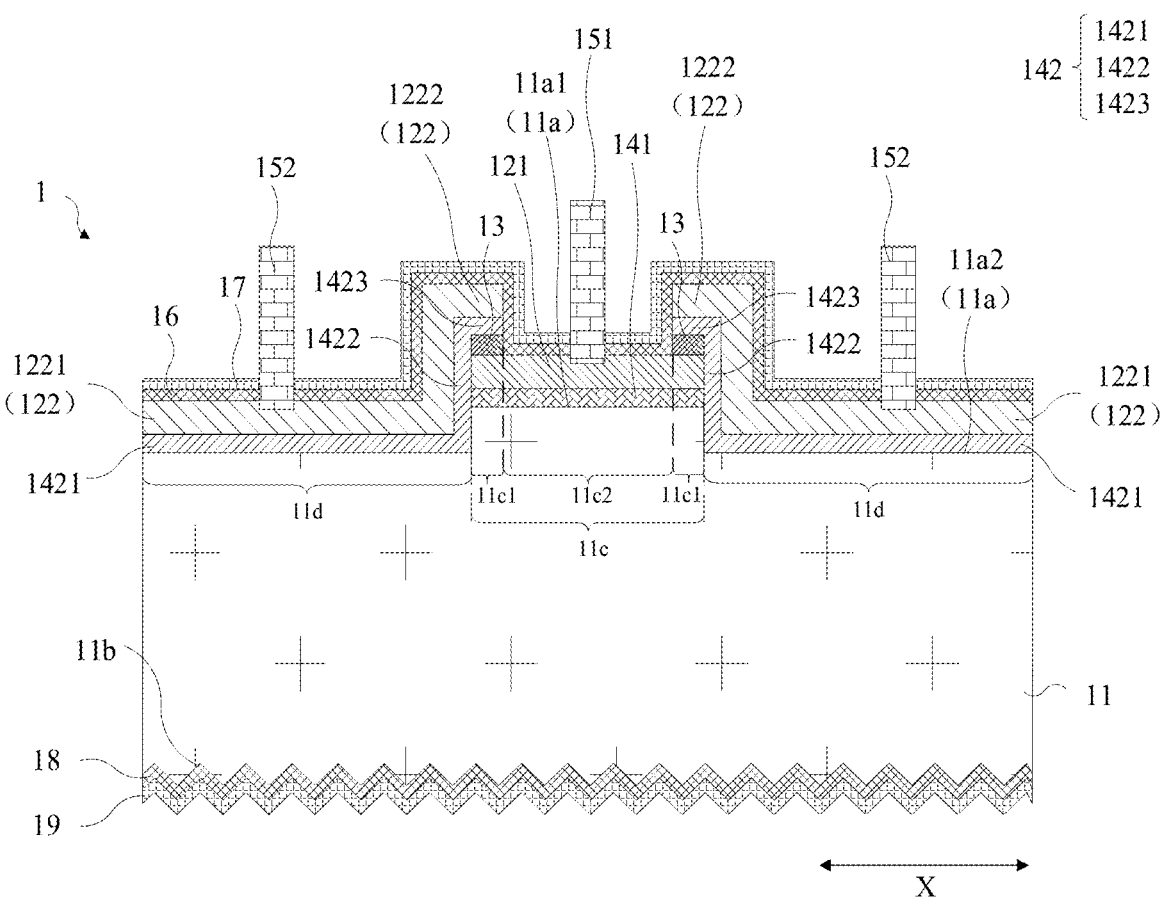
FIG. 3 is a schematic structural sectional partial view of a solar cell according to another embodiment of the present application.

In some embodiments, referring to FIG. 1 and FIG. 3, the second tunneling layer 142 includes a first sub-tunneling layer 1421 and a second sub-tunneling layer 1422. The first sub-tunneling layer 1421 is disposed on the second sub-surface 11*a*2. The second sub-tunneling layer 1422 is disposed on the sidewall of the first emitter 121 that is adjacent to the second region 11*d*, and the second sub-tunneling layer 1422 is located between the first emitter 121 and the first sub-emitter 1221. Specifically, the second sub-tunneling layer 1422 is disposed on the sidewall of the first emitter 121 that is adjacent to the second region 11*d*. Thus, the second sub-tunneling layer 1422 constitutes a section of the leakage current path; that is, the leakage current passes through the second sub-tunneling layer 1422 during its conduction between the first electrode 151 and the second electrode 152.

In some embodiments, referring to FIG. 1, the first sub-tunneling layer 1421 is spaced apart from the second sub-tunneling layer 1422; that is, the first sub-tunneling layer 1421 is not in contact with the second sub-tunneling layer 1422. Furthermore, the first sub-emitter 1221 covers at least the surface of the first sub-tunneling layer 1421 away from the semiconducting substrate 11, the sidewall of the first tunneling layer 141 adjacent to the second region 11*d*, and the sidewall of the second sub-tunneling layer 1422 adjacent to the second region 11*d*.

It should be noted that, in the preparation of the solar cell 1, the first emitter 121 and the first tunneling layer 141 are formed first, followed by the second tunneling layer 142 and the second emitter 122. When the second tunneling layer 142 is formed by using a thermal oxidation method, the second tunneling layer 142 cannot be grown from the sidewall of the first tunneling layer 141, thus leaving the sidewall of the first tunneling layer 141 exposed. Thus, through the formation of the second emitter 122, the sidewall of the first tunneling layer 141 can be covered by the second emitter 122.

In some embodiments, as shown in FIG. 3, one end of the second sub-tunneling layer 1422 is connected to the first sub-tunneling layer 1421, while the other end of the second sub-tunneling layer 1422 extends in the direction away from the semiconducting substrate 11. The second sub-tunneling layer 1422 covers at least the sidewall of the first tunneling layer 141 adjacent to the second region 11*d*, the sidewall of the first emitter 121 adjacent to the second region 11*d*, and the sidewall of the insulating layer 13 adjacent to the second region 11*d*. The second tunneling layer 142 can further include a third sub-tunneling layer 1423, which is connected to, and e.g., in contact with, the second sub-tunneling layer 1422. The third sub-tunneling layer 1423 is located between the insulating layer 13 and the second sub-emitter 1222. In some embodiments, the first sub-tunneling layer 1421 and the second sub-tunneling layer 1422 are integrally formed. In some embodiments, the first sub-tunneling layer 1421, the second sub-tunneling layer 1422, and third sub-tunneling layer 1423 are integrally formed.

Thus, the second tunneling layer 142 can be formed as a continuous structure by using a film deposition method, covering the second sub-surface 11a2, the sidewall of the first tunneling layer 141 adjacent to the second region 11d, the sidewall of the first emitter 121 adjacent to the second region 11d, the sidewall of the insulating layer 13 adjacent to the second region 11d, and the surface of the insulating layer 13 away from the semiconducting substrate 11.

In some embodiments, referring to FIG. 1 and FIG. 2, the first electrode 151 is disposed on the side of the first emitter 121 that is away from the semiconducting substrate 11, and the first electrode 151 is electrically connected to the first emitter 121. The first electrode 151 is spaced apart from the insulating layer 13. The second electrode 152 is disposed on the side of the second emitter 122 that is away from the semiconducting substrate 11, and the second electrode 152 is electrically connected to the second emitter 122.

The first electrode 151 being spaced apart from the insulating layer 13 means that there is a distance between the surface of the insulating layer 13 adjacent to the first electrode 151 and the surface of the first electrode 151 adjacent to the insulating layer 13. In formation of the first electrode 151, an opening is laser-etched above the first emitter 121, and the opening is large enough to allow the first electrode 151 to be formed therein, so as to achieve a good ohmic contact between the first electrode 151 and the first emitter 121.

In some embodiments, referring to FIG. 2, the sidewall of the insulating layer 13 adjacent to the first electrode 151 is spaced apart from the center of the first emitter 121 by a first distance S along the first direction X. The first distance S ranges from 3 μm to 10000 μm. Exemplarily, the first distance S can be 3 μm, 30 μm, 40 μm, 55 μm, 65 μm, 80 μm, 90 μm, 100 μm, 1000 μm, 10000 μm, or any value between these numbers.

The center of the first electrode 151 may coincide with the center of the first emitter 121, or the center of the first electrode 151 approximately coincides with the center of the first emitter 121, in other words, the center of the first electrode 151 may slightly deviate from the center of the first emitter 121. By having the first distance S within the above range, the size of the laser-etched opening is sufficient to form the first electrode 151 having a good ohmic contact with the first emitter 121.

In some embodiments, the size of the insulating layer 13 along the first direction X is defined as a first dimension W, which satisfies:

$$0<W<L;$$

where L is the distance between the sidewall of the first electrode 151 adjacent to the insulating layer 13 and the sidewall of the first emitter 121 adjacent to the second region 11d. Here, the first dimension W can be understood as the width of the insulating layer 13.

As such, on the one hand, there is a space for forming the insulating layer 13 on the first emitter 121; on the other hand, the laser-etched opening is large enough for forming the first electrode 151 having a good ohmic contact with the first emitter 121.

In some embodiments, the thickness of the first emitter 121 is in a range from 5 nm to 2500 nm. Exemplarily, the thickness of the first emitter 121 can be 5 nm, 10 nm, 50 nm, 80 nm, 100 nm, 125 nm, 150 nm, 180 nm, 220 nm, 245 nm, 250 nm, 500 nm, 1000 nm, 1500 nm, 2000 nm, 2500 nm, or any value between these numbers. By having the thickness of the first emitter 121 within the above range, on the on hand, a robust electrical connection between the first electrode 151 and the first emitter 121 can be achieved; on the other hand, the resistance of the first emitter 121 can be increased, reducing current leakage, thus enhancing the performance of the solar cell 1.

In some embodiments, the thickness of the second emitter 122 is in a range from 5 nm to 2500 nm. Exemplarily, the thickness of the second emitter 122 can be 5 nm, 10 nm, 50 nm, 80 nm, 100 nm, 125 nm, 150 nm, 180 nm, 220 nm, 245 nm, 250 nm, 500 nm, 1000 nm, 1500 nm, 2000 nm, 2500 nm, or any value between these numbers. By having the thickness of the second emitter 122 within the above range, on the on hand, a robust electrical connection between the second electrode 152 and the second emitter 122 can be achieved; on the other hand, the resistance of the second emitter 122 can be increased, reducing leakage current, thus enhancing the performance of the solar cell 1.

In some embodiments, the first emitter 121 is doped with oxygen, nitrogen, carbon, or any combination thereof. It can be understood that in these embodiments, the first emitter 121 is further doped with oxygen, nitrogen, carbon, or any combination thereof in addition to doping with n-type dopants (or p-type dopants). This is beneficial for increasing the resistance of the first emitter 121, reducing leakage current, thus improving the performance of the solar cell 1.

In some embodiments, the second emitter 122 is doped with oxygen, nitrogen, carbon, or any combination thereof. It can be understood that in these embodiments, the second emitter 122 is further doped with oxygen, nitrogen, carbon, or any combination thereof in addition to doping with n-type dopants (or p-type dopants). This is beneficial for increasing the resistance of the second emitter 122, reducing leakage current, thus enhancing the performance of the solar cell 1.

It can be understood that alternatively the first emitter 121 and/or the second emitter 122 can be doped without oxygen, nitrogen, and/or carbon.

In some embodiments, the insulating layer 13 is a silicon oxide dielectric layer. It can be understood that the silicon oxide dielectric layer on the first emitter 121 can be a byproduct formed during the forming process of the first emitter 121. Thus, the preparation cost of the solar cell 1 can be reduced using this byproduct as the insulating layer 13.

In some embodiments, the solar cell 1 further includes a first passivation layer 16, a first anti-reflection layer 17, a second passivation layer 18, and/or a second anti-reflection layer 19. The first passivation layer 16 is disposed on the side of the first emitter 121 and the second emitter 122 that is away from the semiconducting substrate 11. The first anti-reflection layer 17 is disposed on the side of the first passivation layer 16 that is away from the semiconducting substrate 11. The second passivation layer 18 is disposed on the second surface 11b. The second anti-reflection layer 19 is disposed on the side of the second passivation layer 18 that is away from the semiconducting substrate 11.

In some embodiments, both the first emitter 121 and the second emitter 122 are made of polysilicon. In some embodiments, the first emitter 121 is a polysilicon film doped with a p-type dopant, and the second emitter 122 is a polysilicon film doped with an n-type dopant.

In some embodiments, the doping concentration of the first emitter 121 ranges from $5\times10^{18}$ cm$^{-3}$ to $5\times10^{20}$ cm$^{-3}$. Exemplarily, the doping concentration of the first emitter 121 can be $5\times10^{18}$ cm$^{-3}$, $8\times10^{18}$ cm$^{-3}$, $1\times10^{19}$ cm$^{-3}$, $5\times10^{20}$ cm$^{-3}$, or any value between these numbers.

In some embodiments, the doping concentration of the second emitter 122 ranges from $1\times10^{19}$ cm$^{-3}$ to $5\times10^{20}$ cm$^{-3}$. Exemplarily, the doping concentration of the second emitter 122 can be $5\times10^{18}$ cm$^{-3}$, $8\times10^{18}$ cm$^{-3}$, $1\times10^{19}$ cm$^{-3}$, $5\times10^{20}$ cm$^{-3}$, or any value between these numbers.

In some embodiments, the thickness of the first tunneling layer 141 ranges from 0.5 nm to 3 nm. Exemplarily, the thickness of the first tunneling layer 141 can be 0.5 nm, 1 nm, 1.5 nm, 2.1 nm, 2.6 nm, 3 nm, or any value between these numbers.

In some embodiments, the thickness of the second tunneling layer 142 ranges from 0.5 nm to 3 nm. Exemplarily, the thickness of the second tunneling layer 142 can be 0.5 nm, 1 nm, 1.5 nm, 2.1 nm, 2.6 nm, 3 nm, or any value between these numbers.

In some embodiments, the thickness of the semiconducting substrate 11 ranges from 30 μm to 300 μm. Exemplarily, the thickness of the semiconducting substrate 11 can be 30 μm, 80 μm, 120 μm, 160 μm, 220 μm, 260 μm, 300 μm, or any value between these numbers.

In some embodiments, the resistivity of the semiconducting substrate 11 ranges from 0.1 Ω·cm to 50 Ω·cm. Exemplarily, the resistivity of the semiconducting substrate 11 can be 0.1 Ω·cm, 5 Ω·cm, 12 Ω·cm, 25 Ω·cm, 35 Ω·cm, 45 Ω·cm, 50 Ω·cm, or any value between these numbers.

In some embodiments, the first passivation layer 16 can be made of aluminum oxide, silicon nitride, etc.

In some embodiments, the second passivation layer 18 can be made of aluminum oxide, silicon nitride, etc.

In some embodiments, the first anti-reflection layer 17 can be made of silicon nitride, titanium oxide, magnesium fluoride, etc.

In some embodiments, the second anti-reflection layer 19 can be made of silicon nitride, titanium oxide, magnesium fluoride, etc.

According to a second aspect of the present application, referring to FIG. 4, an embodiment of a method for preparing a solar cell is provided, which can be used to prepare the solar cell described in the first aspect. Specifically, the preparation method includes S100 and S200:

In S100, a semiconducting substrate is provided. The semiconducting substrate includes a first surface and a second surface opposite to each other. The semiconducting substrate includes a first region and a second region arranged adjacent to each other in a first direction. The first region includes a first sub-region and a second sub-region arranged adjacent to each other in the first direction. The first sub-region is in contact with the second region. The first direction is perpendicular to the thickness direction of the semiconducting substrate. Exemplarily, the material of the semiconducting substrate can be silicon. It can be understood that, in S100, a cleaning solution can be used to remove contaminants from the semiconducting substrate. In an example, the cleaning solution is an alkaline solution.

In S200, first and second emitters are formed on the first surface, and an insulating layer is formed on the first emitter and on the first sub-region. The first emitter is formed on the first region. The second emitter includes a first sub-emitter and a second sub-emitter, and the first and second sub-emitters are connected with each other. The first sub-emitter is formed on the second region. The second sub-emitter is formed on the insulating layer. Electrical conduction is formed between the first emitter and the first sub-emitter, so as to form a current leakage path.

In the solar cell and the preparation method thereof provided by the embodiments of the present application, the insulating layer is formed on the first emitter, the first sub-emitter of the second emitter is located on the second region, the second sub-emitter of the second emitter is formed on the insulating layer, and a current leakage path is formed between the first emitter and the first sub-emitter. In this way, on the one hand, in a group of solar cells connected in series, when one solar cell is shaded and does not work, the current leakage path in this solar cell allows the current to flow through, thereby preventing the hotspot effect in the photovoltaic module and increasing the lifetime of the solar cell. On the other hand, the insulating layer is sandwiched between the first emitter and the second sub-emitter, the current leakage area between the first emitter and the second emitter can be reduced, thereby reducing the leakage current, which is conducive to enhancing the working efficiency of the solar cell. Moreover, during the preparation process of the solar cell, the insulating layer can also protect the first emitter, reducing damage to the first emitter in the preparation process, thus improving the structural integrity of the first emitter, which is thus beneficial for improving the performance of the solar cell.

In some embodiments, S200 specifically includes S210 to S250.

In S210, a first tunneling material layer, a first emitter material layer, and a first silicon oxide dielectric material layer are formed as a stack on the first surface, and the semiconducting substrate with the stacked layers is subjected to a first heat treatment.

Exemplarily, the first tunneling material layer can be formed by using a plasma oxidation method or a thermal oxidation method. Exemplarily, the first emitter material layer can be formed by one of the following two methods. In the first method, the first emitter material layer is formed by using plasma enhanced chemical vapor deposition (PECVD), and the first emitter material layer can be formed to contain a doping element (such as boron or phosphorus); then, the first silicon oxide dielectric material layer is deposited on the first emitter material layer by using PECVD. In the second method, the first emitter material layer is formed by using low pressure chemical vapor deposition (LPCVD), and the first emitter material layer may contain or not contain any doping element (such as boron or phosphorus).

Exemplarily, the first heat treatment can be carried out at a temperature ranging from 700° C. to 1100° C. If the first emitter material layer is formed using the first method as described above, the first heat treatment activates the doping element (such as boron or phosphorus) contained in the first emitter material layer, with the first silicon oxide dielectric material layer serving as a protection. If the first emitter material layer is formed using the second method as described above, there can be two scenarios. On the condition that the first emitter material layer contains a doping element (such as boron or phosphorus), the first heat treatment not only activates the doping element (such as boron or phosphorus), but also forms a first silicon oxide dielectric material layer on the first emitter material layer due to the high-temperature oxidation by the first heat treatment. On the condition that the first emitter material layer does not contain any doping element (such as boron or phosphorus), the doping element can be externally introduced into the first emitter material layer during the first heat treatment, for example, through boron diffusion or phosphorus diffusion, and thus the first silicon oxide dielectric material layer also can be formed during the first heat treatment.

In some embodiments, the material of the first tunneling material layer is silicon oxide, and the material of the initially deposited first emitter material layer is a mixture of microcrystalline silicon and amorphous silicon. During the first heat treatment, the mixture of microcrystalline silicon and amorphous silicon further crystallizes to form a crystallized silicon material layer containing a dopant.

In S220, the first silicon oxide dielectric material layer, the first emitter material layer, and the first tunneling material layer on the second region are removed. Exemplarily, the above regions of layers can be removed by using laser etching or wet etching.

In S230, a second tunneling material layer, a second emitter material layer, and a second silicon oxide dielectric material layer are formed as a stack on the first surface, and the semiconducting substrate with the stacked layers is subjected to a second heat treatment.

Exemplarily, the second tunneling material layer can be formed by using a plasma oxidation method or a thermal oxidation method. Exemplarily, the second emitter material layer can be formed by one of the following two methods. In the first method, the second emitter material layer is formed by using PECVD. The second emitter material layer can be formed to contain a doping element, which is different from the doping element contained in the first emitter material layer in doping type. For example, when the doping element of the first emitter material layer is boron, the doping element of the second emitter material layer is phosphorus, and vice versa. Then, the second silicon oxide dielectric material layer is deposited on the second emitter material layer by using PECVD. In the second method, the second emitter material layer is formed by using LPCVD, and the second emitter material layer may contain or not contain any doping element. The doping element contained in the second emitter material layer is different from the doping element contained in the first emitter material layer in doping type. For example, when the doping element of the first emitter material layer is boron, the doping element of the second emitter material layer is phosphorus, and vice versa.

Exemplarily, the second heat treatment can be carried out at a temperature ranging from 700° C. to 1100° C. If the second emitter material layer is formed using the first method as described above, the second heat treatment activates the doping element (such as boron or phosphorus) contained in the second emitter material layer, with the second silicon oxide dielectric material layer serving as a protection. If the second emitter material layer is formed using the second method as described above, there can be two scenarios. On the condition that the second emitter material layer contains a doping element (such as boron or phosphorus), the second heat treatment not only activates the doping element (such as boron or phosphorus), but also forms a second silicon oxide dielectric material layer on the second emitter material layer due to the high-temperature oxidation by the second heat treatment. On the condition that the second emitter material layer does not contain any doping element (such as boron or phosphorus), the doping element can be externally introduced into the second emitter material layer during the second heat treatment, for example, through boron diffusion or phosphorus diffusion, noting that the doping element introduced into the second emitter material layer is different from the doping element introduced into the first emitter material layer in doping type, and thus the second silicon oxide dielectric material layer also can be formed during the second heat treatment.

In some embodiments, the material of the second tunneling material layer is silicon oxide, and the material of the initially deposited second emitter material layer is a mixture of microcrystalline silicon and amorphous silicon. During the second heat treatment, the mixture of microcrystalline silicon and amorphous silicon further crystallizes to form a crystallized silicon material layer containing a dopant.

In S240, the second silicon oxide dielectric material layer, the second emitter material layer, the second tunneling material layer, and the first silicon oxide dielectric material layer in the second sub-region are removed. Exemplarily, the above regions of layers can be removed by using laser etching or wet etching.

In S250, the second silicon oxide dielectric material layer on the other regions (including the second region and the first sub-region) on the first surface of the semiconducting substrate is removed. Thus, the first tunneling layer, the first emitter, the insulating layer, the second tunneling layer, and the second emitter are formed. The insulating layer is the first silicon oxide dielectric material layer remaining on the first emitter on the first sub-region.

In some embodiments, the preparation method further includes S300 to S500.

In S300, a first passivation layer is formed on the first surface, and a second passivation layer is formed on the second surface.

In S400, a first anti-reflection layer is formed on the first passivation layer, and a second anti-reflection layer is formed on the second passivation layer.

In S500, first and second electrodes are formed on the first surface. Specifically, conductive pastes can be printed in the areas corresponding to the first and second emitters and then sintered. During the sintering process, the first and second electrodes burn through the first passivation layer and the first anti-reflection layer to make contact with the first emitter and the second emitter, respectively.

It should be understood that, in the method of the embodiments of the present application, at least some of the steps can include multiple sub-steps or multiple stages, these sub-steps or stages are not necessarily performed at the same time, but may be performed at different times. These sub-steps or stages are not necessarily to be sequentially performed, but can be performed alternately or in turn with at least some of the sub-steps or stages of other steps.

According to a third aspect of the present application, an embodiment of a photovoltaic module includes the solar cell described in any of the embodiments of the first aspect.

Exemplarily, the photovoltaic module includes a plurality of solar cells, which can be connected in series through welding strips, thereby aggregating the electrical energy generated by individual solar cells for subsequent transmission. Specifically, the first electrodes of each solar cell are electrically connected to the second electrodes of an adjacent solar cell by welding strips, and the second electrodes of each solar cell are electrically connected to the first electrodes of another adjacent solar cell by conductive strips, so that the solar cells are connected in series. The solar cells can be arranged at intervals, or can be stacked together in an imbricated form.

Furthermore, the photovoltaic module further includes an encapsulation layer and a cover plate (not shown). The encapsulation layer is configured to cover the surface of the solar cells connected in series. The cover plate is configured to cover the surface of the encapsulation layer away from the solar cells. The solar cells are electrically connected to form a whole piece or multiple pieces, such as forming a plurality of cell groups. The plurality of cell groups are electrically connected in series and/or in parallel. Specifically, in some embodiments, the plurality of cell groups can be electrically connected through conductive strips. The encapsulation layer covers the surface of the solar cells. Exemplarily, the encapsulation layer can be an organic encapsulation film, such as an ethylene-vinyl acetate copolymer film, a polyethylene-octene elastomer film, or a polyethylene terephthalate film. The cover plate can have a light-transmitting function, such as a glass cover plate, a plastic cover plate, or the like.

According to a fourth aspect of the present application, an embodiment of a photovoltaic system includes the photovoltaic module in the third aspect.

The photovoltaic system can be applied to photovoltaic power stations, such as ground power stations, roof power stations, water surface power stations, etc. Alternatively, the photovoltaic system can be applied to equipment or devices that use solar energy to generate electricity, such as user solar power supplies, solar street lights, solar cars, solar buildings, etc. It can be understood that the application scenarios of the photovoltaic system are not limited to the above, that is, the photovoltaic system can be applied in all fields that need to use solar energy to generate electricity. Taking a photovoltaic power generation network as an example, the photovoltaic system can include photovoltaic arrays, a combiner box, and an inverter. The photovoltaic array can be an array of multiple photovoltaic modules. For example, the multiple photovoltaic modules can form multiple photovoltaic arrays. The photovoltaic arrays are connected to the combiner box, which can combine the currents generated by the photovoltaic arrays. The combined current flows through the inverter and is converted into the alternating current suitable for the power grid, and then connected to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A solar cell, comprising:
a semiconducting substrate comprising a first surface and a second surface that are opposite to each other, the semiconducting substrate comprising a first region and a second region that are arranged adjacent to each other in a first direction, the first region comprising a first sub-region and a second sub-region that are arranged adjacent to each other in the first direction, the first sub-region being in contact with the second region, the first direction being perpendicular to the thickness direction of the semiconducting substrate;
a first emitter disposed on the first surface and located on the first region;
an insulating layer disposed on the first emitter and located on the first sub-region; and a second emitter disposed on the first surface, the second emitter comprising a first sub-emitter and a second sub-emitter that are connected with each other, the first sub-emitter being located on the second region, the second sub-emitter being disposed on the insulating layer, wherein electrical conduction exists between the first emitter and the first sub-emitter,
wherein (i) the first emitter is doped with oxygen, nitrogen, carbon, or any combination thereof, and/or (ii) the second emitter is doped with oxygen, nitrogen, carbon, or any combination thereof.

2. The solar cell according to claim 1, wherein the first surface comprises a first sub-surface located in the first region and a second sub-surface located in the second region, the minimum distance between the first sub-surface and the second surface is greater than the minimum distance between the second sub-surface and the second surface;
the first emitter is disposed on the first sub-surface, and the first sub-emitter is disposed on the second sub-surface;
along the first direction, an orthogonal projection of the first emitter on a first plane overlaps with an orthogonal projection of the first sub-emitter on the first plane, the first emitter comprises a sidewall adjacent to the second region, and electrical conduction exists between the sidewall and the first sub-emitter; the first plane is parallel to the thickness direction of the semiconducting substrate and perpendicular to the first direction.

3. The solar cell according to claim 2, further comprising:
a first tunneling layer disposed between the first emitter and the semiconducting substrate; and
a second tunneling layer disposed between the second emitter and the semiconducting substrate;
wherein a portion of the second tunneling layer is disposed on the sidewall of the first emitter that is adjacent to the second region and is disposed between the first emitter and the first sub-emitter.

4. The solar cell according to claim 3, wherein the second tunneling layer comprises:
a first sub-tunneling layer disposed on the second sub-surface; and
a second sub-tunneling layer disposed on the sidewall of the first emitter that is adjacent to the second region, wherein the second sub-tunneling layer is located between the first emitter and the first sub-emitter.

5. The solar cell according to claim 4, wherein the first sub-tunneling layer is spaced apart from the second sub-tunneling layer;
the first sub-emitter covers at least a surface of the first sub-tunneling layer away from the semiconducting substrate, a sidewall of the first tunneling layer adjacent to the second region, and a sidewall of the second sub-tunneling layer adjacent to the second region.

6. The solar cell according to claim 4, wherein one end of the second sub-tunneling layer is connected to the first sub-tunneling layer, while another end of the second sub-tunneling layer extends in a direction away from the semiconducting substrate;
the second sub-tunneling layer covers at least a sidewall of the first tunneling layer adjacent to the second region, a sidewall of the first emitter adjacent to the second region, and a sidewall of the insulating layer adjacent to the second region;
the second tunneling layer further comprises a third sub-tunneling layer, the third sub-tunneling layer is connected to the second sub-tunneling layer, and is located between the insulating layer and the second sub-emitter.

7. The solar cell according to claim 1, further comprising:

a first electrode disposed on a side of the first emitter that is away from the semiconducting substrate and electrically connected to the first emitter, the first electrode being spaced apart from the insulating layer; and a second electrode disposed on a side of the second emitter that is away from the semiconducting substrate and electrically connected to the second emitter.

8. The solar cell according to claim 7, wherein a sidewall of the insulating layer adjacent to the first electrode is spaced apart from the center of the first emitter by a first distance along the first direction, the first distance ranges from 3 μm to 10000 μm.

9. The solar cell according to claim 7, further satisfying:

$$0 < W < L;$$

wherein W is a size of the insulating layer along the first direction, and L is a distance between a sidewall of the first electrode adjacent to the insulating layer and a sidewall of the first emitter adjacent to the second region.

10. The solar cell according to claim 1, wherein a thickness of the first emitter is in a range from 5 nm to 2500 nm.

11. The solar cell according to claim 1, wherein a thickness of the second emitter is in a range from 5 nm to 2500 nm.

12. The solar cell according to claim 1, wherein the insulating layer is a silicon oxide dielectric layer.

13. The solar cell according to claim 1, further comprising:

a first passivation layer disposed on a side of the first emitter and the second emitter that is away from the semiconducting substrate;

a first anti-reflection layer disposed on a side of the first passivation layer that is away from the semiconducting substrate;

a second passivation layer disposed on the second surface; and a second anti-reflection layer disposed on the side of the second passivation layer that is away from the semiconducting substrate.

14. A photovoltaic module, comprising the solar cell according to claim 1.

15. A photovoltaic system, comprising the photovoltaic module according to claim 14.

16. A solar cell, comprising:

a semiconducting substrate comprising a first surface and a second surface that are opposite to each other, the semiconducting substrate comprising a first region and a second region that are arranged adjacent to each other in a first direction, the first region comprising a first sub-region and a second sub-region that are arranged adjacent to each other in the first direction, the first sub-region being in contact with the second region, the first direction being perpendicular to the thickness direction of the semiconducting substrate;

a first emitter disposed on the first surface and located on the first region;

an insulating layer disposed on the first emitter and located on the first sub-region;

a second emitter disposed on the first surface, the second emitter comprising a first sub-emitter and a second sub-emitter that are connected with each other, the first sub-emitter being located on the second region, the second sub-emitter being disposed on the insulating layer, wherein electrical conduction exists between the first emitter and the first sub-emitter;

a first passivation layer disposed on a side of the first emitter and the second emitter that is away from the semiconducting substrate;

a first anti-reflection layer disposed on a side of the first passivation layer that is away from the semiconducting substrate;

a second passivation layer disposed on the second surface; and a second anti-reflection layer disposed on the side of the second passivation layer that is away from the semiconducting substrate.

\* \* \* \* \*